United States Patent [19]
Conboy et al.

[11] Patent Number: 5,904,487
[45] Date of Patent: May 18, 1999

[54] ELECTRODE RESHAPING IN A SEMICONDUCTOR ETCHING DEVICE

[75] Inventors: Michael R. Conboy, Buda; Elfido Coss, Jr., Austin, both of Tex.

[73] Assignee: Advanced Micro Devices, Inc.

[21] Appl. No.: 08/731,028

[22] Filed: Oct. 8, 1996

[51] Int. Cl.[6] .................................................. G01N 19/08
[52] U.S. Cl. ........................... 438/14; 438/719; 438/729; 156/345; 118/723 E
[58] Field of Search ............................. 438/14, 714, 719, 438/729; 216/59, 67, 71; 118/712, 713, 723 E; 156/345

[56] References Cited

U.S. PATENT DOCUMENTS

| | | | |
|---|---|---|---|
| 4,340,462 | 7/1982 | Koch | 204/298.35 |
| 4,908,095 | 3/1990 | Kagatsumi et al. | 216/67 |
| 5,248,371 | 9/1993 | Maher et al. | 156/345 |

*Primary Examiner*—Bruce Breneman
*Assistant Examiner*—Allan Olsen
*Attorney, Agent, or Firm*—Kevin L. Daffer; Conley, Rose & Tayon

[57] ABSTRACT

An electrode reshaping process and apparatus is provided for use in a semiconductor etching device. A wafer is place between upper and lower electrodes of the semiconductor etching device. The apparatus and method selectively adjusts the shape of an upper electrode in the semiconductor etching device to compensate for non-uniformities inherent in the etching device. One or more motors attached to the upper electrode provide the electrode shaping forces in accordance with information provided by etch rate variation models stored in a host computer. With the shape of the upper electrode adjusted, the wafer can be etched more uniformly.

25 Claims, 8 Drawing Sheets

ELECTRODE RESHAPING IN A SEMICONDUCTOR ETCHING DEVICE

BACKGROUND OF THE INVENTION

1. Field of the Invention

The present invention relates to the art of semiconductor manufacturing and more particularly to a technique for reshaping an electrode in a semiconductor etching device.

2. Description of the Relevant Art

It is well known that during integrated circuit manufacturing, whole wafers are coated with a layer or layers of various materials such as silicon dioxide, silicon nitride, or metallization. Unwanted material can be selectively removed using masked photolithography and etchants to leave, for example, holes in a thermal oxide where diffusions are to be made, or long strips of aluminum for electrical interconnect between individual circuit elements. Using conventional techniques, fine-line geometries can be produced by removing or etching select regions of material between the structures.

There are several etching techniques commonly used, including: wet chemical, electrochemical, pure plasma, reactive ion, ion beam milling, sputtering, and high temperature vapor. Wet etching generally involves immersing wafers containing select areas of photoresist in an aqueous etching solution. Wet etching, while the oldest and least expensive technique, is gradually being replaced by dry etching techniques such as plasma etching and a combination plasma/reactive ion etching (RIE). Plasma and RIE techniques, often called dry etching, are relatively new and are performed in low pressure gaseous plasma. Dry etching generally involves fewer safety hazards, less spent chemical disposal problems, and also produces finer line geometric structures.

Dry etching generally requires an etching chamber capable of receiving gaseous plasma and one or more wafers to be etched. The plasma can be pressurized within the chamber and, after etching is completed, the gaseous material and volatile byproducts can be pumped away or evacuated from the chamber. Operating pressure depends upon the material being etched, the plasma chosen, and may range from a few torr to fractions of a millitorr.

The etching chamber includes a pair of electrodes at opposing sides or ends of the chamber. One electrode is generally charged by a RF power supply while the other electrode is grounded. Typically, the powered electrode is DC isolated from the RF generator by a capacitor so that negative electron charge accumulates upon the powered electrode during one half of the RF cycle while positive ion charge accumulates during the next half cycle. Since electrons are more mobile than ions, a negative potential will build upon the powered electrode in order to charge the electrode negative with respect to the grounded electrode and the gaseous plasma between the electrodes. Depending upon conditions, the voltage differential may be several hundred volts.

Dry etching is achieved by placing one or more wafers upon the powered electrode. The present invention will be further explained with respect to one wafer placed on the powered electrode, it being understood that more than one wafer may be placed on the powered electrode during an etching process.

The wafer is positioned to receive positive ions directed from the plasma toward the negatively charged, powered electrode. The ions are accelerated substantially perpendicular to the wafer surface and embedded into the surface. The ions chemically react with the wafer surface. The amount of reaction is often referred to as the etch rate. Etch depth is related to the rate at which the chemical reaction occurs within the wafer. The higher the etch rate, the deeper the resulting etch depth.

It is imperative in dry etching that the etch rate be uniform across the surface of the wafer. A non-uniform etch rate will result in a non-uniform etch depth. This non-uniform etch depth may result in devices from certain areas of the wafer failing to meet design specifications.

Etch rate across the wafer can vary with variations of one or more process parameters including: (1) process parameters associated with the electrodes such as electrode voltage and electrode gap or spacing, (2) process parameters associated with the plasma including pressure, temperature, composition, flow rate, etc., and (3) process parameters associated with the wafer such as temperature. For example, etch rate will vary across the wafer surface with a variation of the plasma pressure across the wafer. Etch rate will also vary across the wafer surface with a variation of voltage across the electrodes due to a varition of electrode gap across the wafer.

Electrode gap variations in general can be controlled in accordance with U.S. Pat. No. 5,354,413, which is incorporated herein by reference. In the aforementioned patent, an electrode position controller is provided which attempts to ensure that the electrodes are properly parallel during the etching process.

The aforementioned technique maintains a uniform gap between the electrodes so long as the electrodes have oppositely facing, planar surfaces. It is well known, however, that the material which forms the upper electrode slightly precipitates during each etching due to the corrosive effects of the plasma. As a result, the lower surface of the upper electrode eventually becomes substantially non-planar after a number of wafers have been etched.

FIGS. 1 and 2 show cross sectional areas of eroded upper electrodes with lower surfaces which have eroded into a non-planar convex or concave shape. The convex or concave shape of these electrodes will produce a variation in electrode gap across the wafer which in turn produces a variation in etch rate and etch depth across the wafer surface. The variations in electrode gap caused by the non-planar surfaces as shown in FIGS. 1 and 2 can not be corrected by the technique disclosed in U.S. Pat. No. 5,354,413.

One solution to this non-planar surface problem is to replace the eroded upper electrode with a new electrode having a substantially planar lower surface. Electrodes, however, are expensive. Each time a worn electrode is replaced, the semiconductor etching device chamber must be opened which provides an opportunity for dust and other contaminants to enter the chamber. Moreover, replacing the worn electrodes is a time consuming process and does not solve the problem of variations in the other process parameters such as variations in plasma pressure or variations in wafer temperature. Variations of these parameters across the wafer, like the electrode gap variations, can produce non-uniform etch rates across the wafer which in turn may produce devices failing to meet design specifications.

SUMMARY OF THE INVENTION

The problems set forth above are, in part, overcome by an improved semiconductor etching device having an upper electrode which can be selectively shaped. By shaping the upper electrode, variations in etch rate and etch depth across the wafer can be reduced.

In accordance thereto, etch rate variations caused by one or more variations in the process parameters may be modeled. The modeling provides information which can be used in selectively reshaping the upper electrode to adjust the gap between the electrodes from one side of the wafer to the other. The adjustment in electrode gap across the wafer can offset variations in etch rate caused by one or more process parameter variations.

The etch rate variations can be modeled by first placing a sample wafer between aligned lower and upper electrodes. An etching material or plasma is then placed between the upper and lower electrodes, and when a voltage difference is applied between the upper and lower electrodes, the etching material reacts with the sample wafer and causes an etching thereof. A plasma analyzer is provided which measures variations in process parameters across the wafer surface such as variances in plasma temperature, pressure, etc. These measurements are stored in memory of a host computer.

Thereafter, the sample wafer is removed and etch depths therein are measured at a plurality of positions across the surface thereof. The etch depths along with their corresponding positions on the etched wafer, are stored in the host computer in connection with the associated plasma analyzer measurements.

Further models can be generated by etching subsequent sample wafers under varying conditions until a sufficiently extensive library is developed. For example, subsequent models may be generated with a change in one of the process parameters such as plasma composition, temperature, etc. Each model in the library contains etch depth measurements at a plurality of wafer surface positions along with process parameter variations provided by the plasma analyzer.

Given the library of models, the upper electrode can be reshaped to reduce etch rate variations in subsequent wafer processing. In particular, a wafer is positioned between the aligned upper and lower electrodes. An etching plasma is provided between the upper and lower electrodes. Variations in the process parameters are measured by the plasma analyzer. Before etching, one or more library models are accessed in accordance with process parameters measured by the plasma analyzer. The etch depth measurements contained in the model or models are analyzed to identify at least one etch depth which radically departs from an average of the etch depths. The wafer position associated with this etch depth is mapped to a position on the upper electrode which was aligned during the etching process. A motor operating in connection with the host computer and a control interface provides a shaping force to the mapped position on the upper electrode wherein the shaping force is calculated to offset expected variations in etch depth.

One advantage of the present invention is that it reduces etch rate variations across the wafer during the etching process.

Another advantage of the present invention is that it produces more uniformly etched geometries across the etched wafer surface.

Another advantage of the present invention is that it produces more devices from a wafer which are in compliance with design specifications.

Yet another advantage of the present invention is that it extends the useful life of the upper electrode in the semiconductor etching device even after the lower surface of the upper electrode has been eroded into a non-planar surface as a result of the corrosive effects of previous plasma etching.

A further advantage of the present invention is that it reduces the number of times the upper electrode needs to be replaced in the semiconductor etching device.

Still another advantage of the present invention is that it reduces the number of times the semiconductor etching device chamber must be exposed to dust and other contaminants.

BRIEF DESCRIPTION OF THE DRAWINGS

Other advantages of the invention will become apparent upon reading the following detailed description and upon reference to the accompanying drawings in which.

Figure 1:
FIG. 1 is a cross-sectional view of a semiconductor etching device with an upper electrode having a concave shape resulting from precipitation of electrode material during previous semiconductor etching processing.
Figure 2:
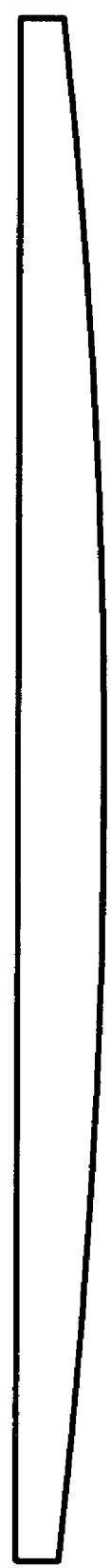
FIG. 2 illustrates a cross-sectional view of a semiconductor etching device with an upper electrode having a convex shape resulting from electrode material precipitation during previous semiconductor etching processing.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
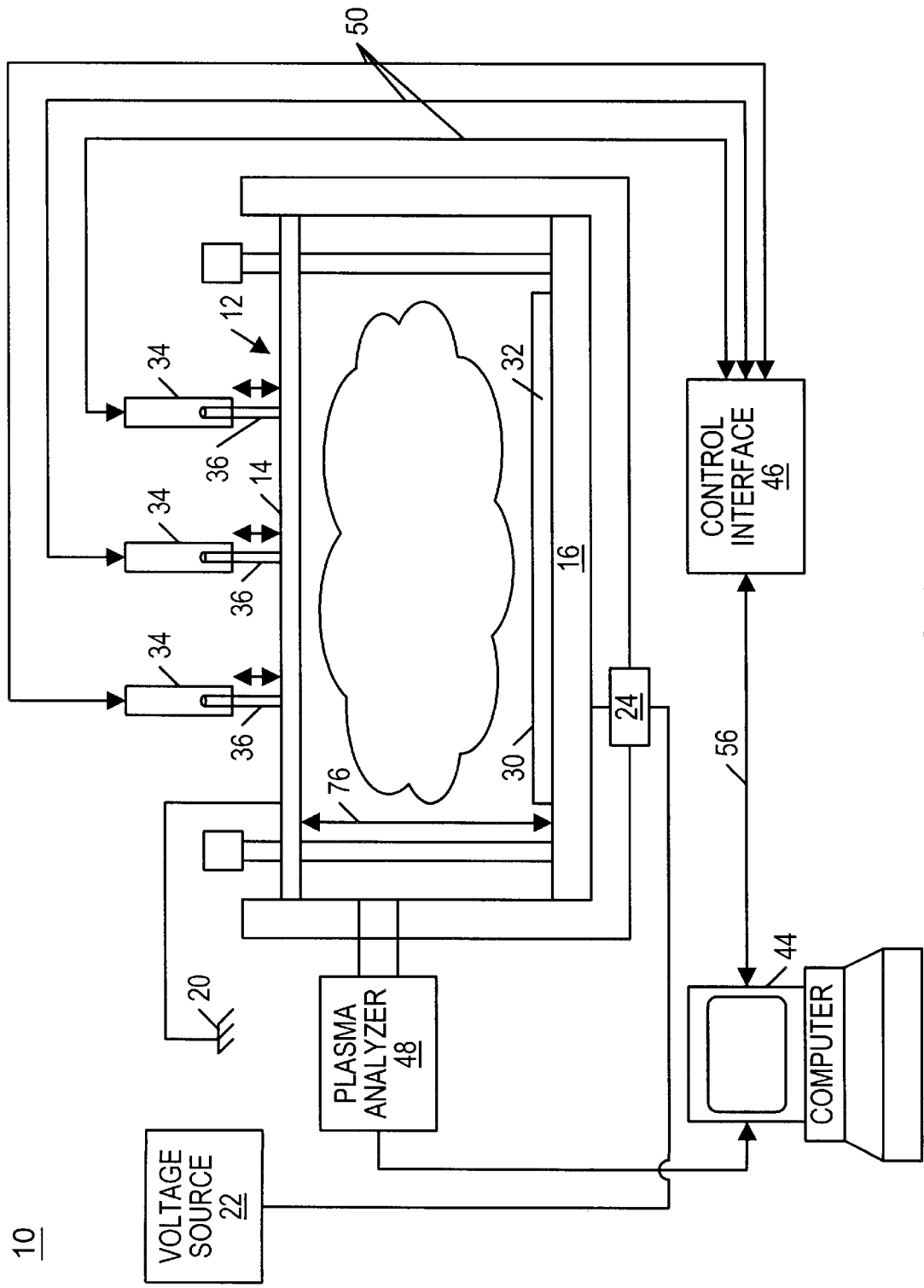
FIG. 3 is a partial side view of semiconductor etching device according to the present invention.

FIG. 3 illustrates a partial sideview of a semiconductor etching device 10 employing the present invention. The semiconductor etching device 10 includes an etching chamber 12, a voltage source 22, a plasma analyzer 48, a computer 44, an interface control 46, and one or more motors 34.

The chamber 12 includes a thin upper electrode 14 formed from a flexible material, and a lower electrode 16 where the upper electrode 14 and lower electrode 16 are aligned with each other. Upper electrode 14 is connected to a power supply, preferably at ground potential 20. Lower electrode 16 is coupled to RF voltage source 22 via capacitor 24. Voltage source 22 can vary in magnitude depending upon process parameters including plasma composition, wafer topography to be etched, etch rate, etc. Capacitor 24 is chosen to block DC voltages upon lower electrode 16.

A etching plasma material is provided between the upper and lower electrodes to a port (not shown). Suitable etching material includes halogen species or various types of freons well known in the art. Ions can be formed within the plasma between the electrodes, and the ions are preferably directed in an anisotropic fashion into surface 30 of wafer 32 by the voltage difference between the upper and lower electrodes. In this manner, wafer 32 receives selective etching in unprotected areas across surface 30. The preferred etching technique shown is pure plasma, RIE, or combination of pure plasma/RIE. The resulting reactant material can be evacuated from chamber 12 to an exhaust port (not shown) after wafer 32 has been etched.

Figure 4:
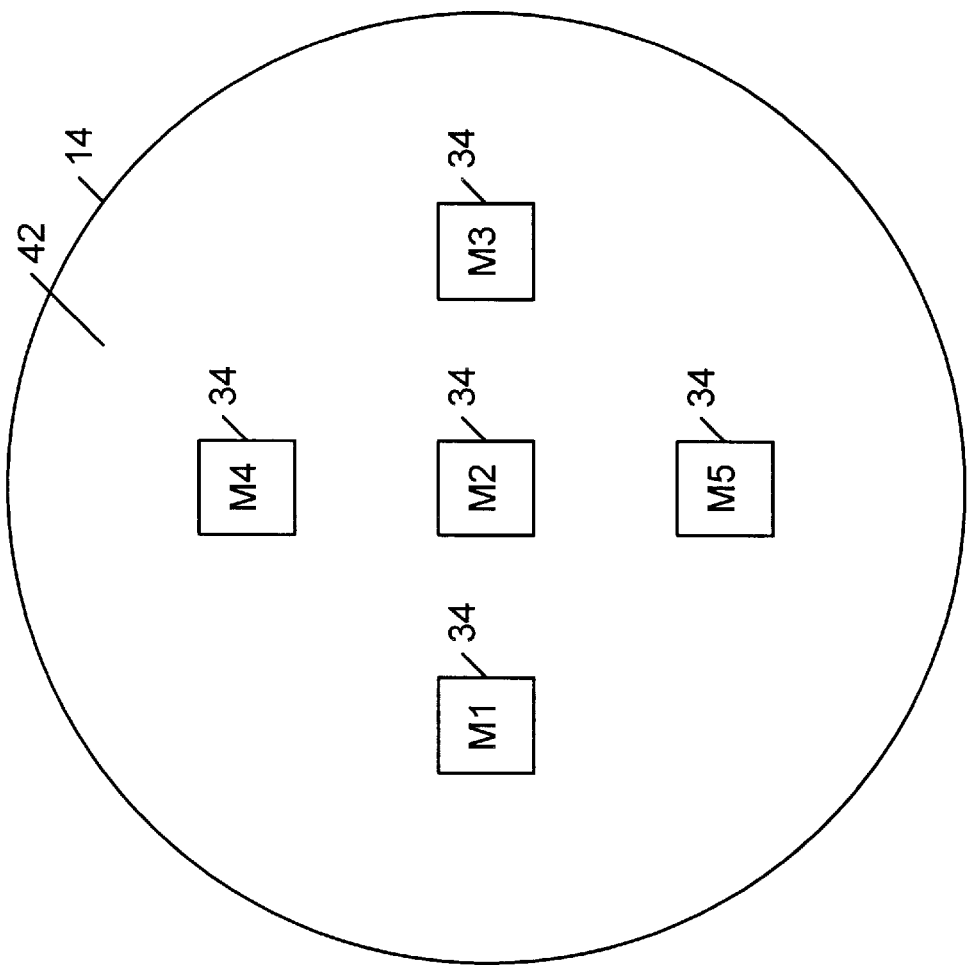
FIG. 4 is a partial top view of the semiconductor etching device of FIG. 3.
Figure 5:
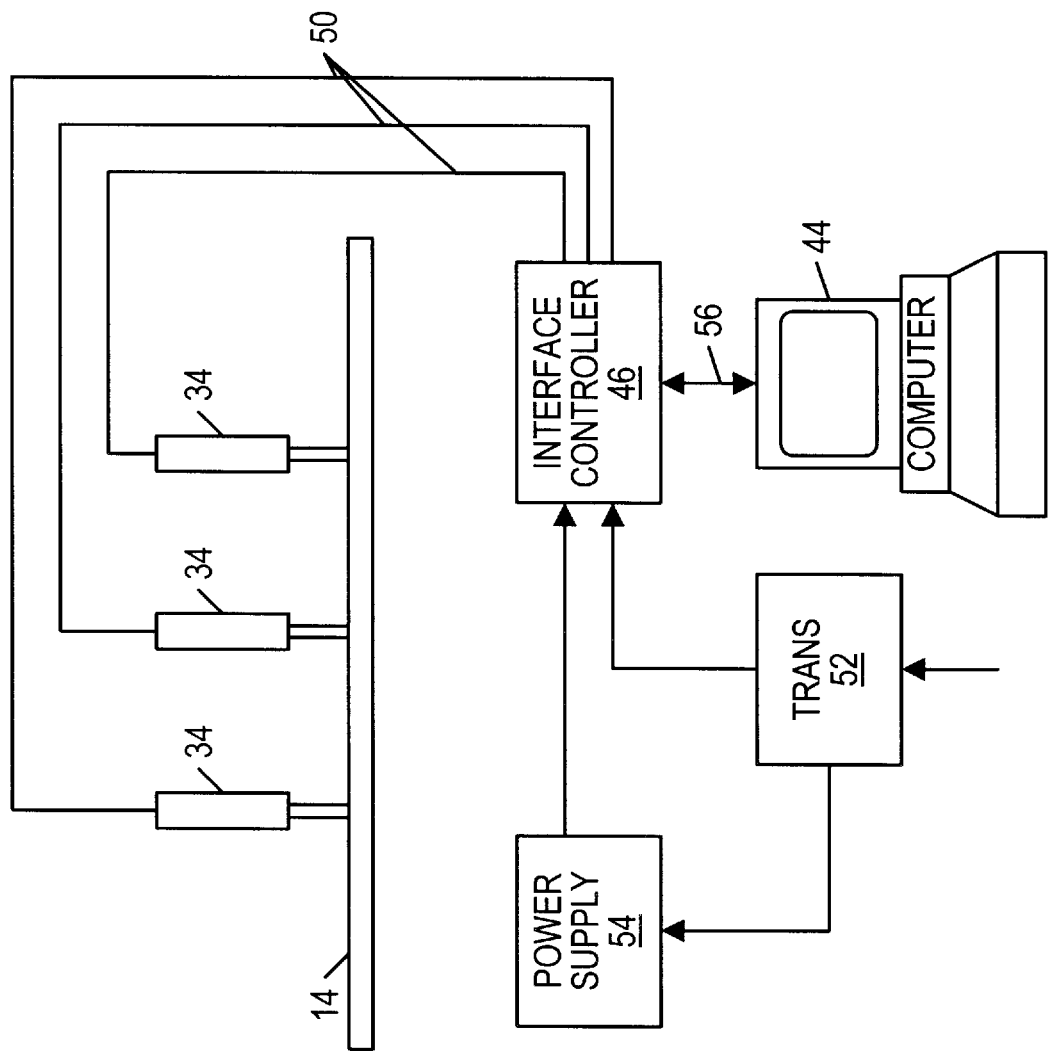
FIG. 5 is a block diagram and associated signal flow of a semiconductor etching device according to the present invention.

One or more motors 34 are connected to upper electrode 14 via shaft 36. FIG. 4 shows a top view of a semiconductor etching chamber 10 with motors 34 attached to upper electrode 14 at various locations, as designated by M1–M5. Motors 34 apply an electrode reshaping force to one or more locations of the upper electrode 14 via shaft 36, wherein the applied force is calculated to reshape electrode 14 to offset etch rate variations in accordance with the present invention. In particular, the applied force or forces reshape upper electrode 14 and adjust the variation of gap 76 from one side of wafer 32 to the other.

The motors 34, and thus the shaping force applied to upper electrode 14, are controlled by computer 44 and control interface 46 via control lines 50. While FIG. 3 shows three motors 34 attached to upper electrode 14 at various locations, it is to be understood that a lesser or greater number of motors 34 may be attached to upper electrode 14 at different locations.

The motors are controlled in accordance with a library of etch rate variation models stored in computer 44. Each model is generated by placing a sample wafer in alignment between upper and lower electrodes 14 and 16. Thereafter, an etching plasma is provided between the upper and lower electrodes. When a voltage difference is applied between the upper and lower electrodes, ions from the plasma are directed into the sample wafer wherein the ions react with the wafer material causing an etching thereof.

Plasma analyzer 48 measures variations of the process parameters within chamber 12 before or during the etching process. In particular, plasma analyzer 48 measures variations in plasma temperature, plasma pressure, etc. from one side of the sample wafer to the other. The measured variations are provided to computer 44 and stored therein.

After the sample wafer has been etched, it is removed from chamber 12 and analyzed. In particular, etch depths at a plurality of positions on the sample wafer surface are measured and stored in computer 44. The measured etch depths are stored associated with the measured process variations provided by plasma analyzer 48 so that the measured etch depths can be subsequently accessed using the process variations as keys.

Subsequent models of etch rate variations are generated using separate sample wafers with one more of the process parameters intentionally altered. For instance, a subsequent model may be generated with a plasma pressure significantly lower than the plasma pressure used to generate other etch rate variation models.

All the models are stored within computer 44 in a library, each model being stored in connection with process parameter variations measured by plasma analyzer 48. Once computer 44 is provided with an extensive library of etch rate variation models, the library can be used in reshaping the upper electrode 14 prior to subsequent real time wafer processing in order to reduce etch rate variations therein.

Figure 7:
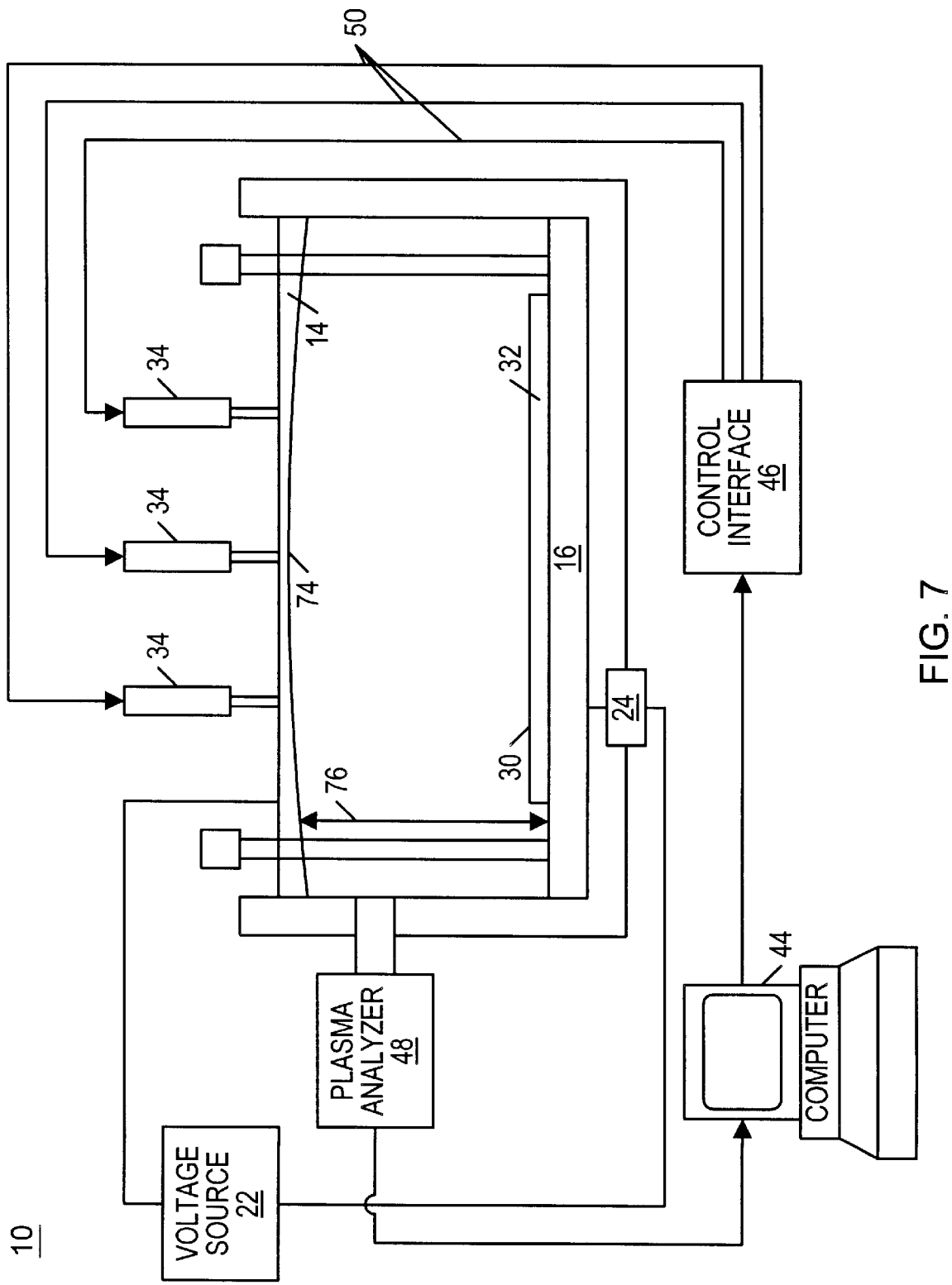
FIG. 7 is a partial side view of a semiconductor etching device having a concave shaped upper electrode.
Figure 8:
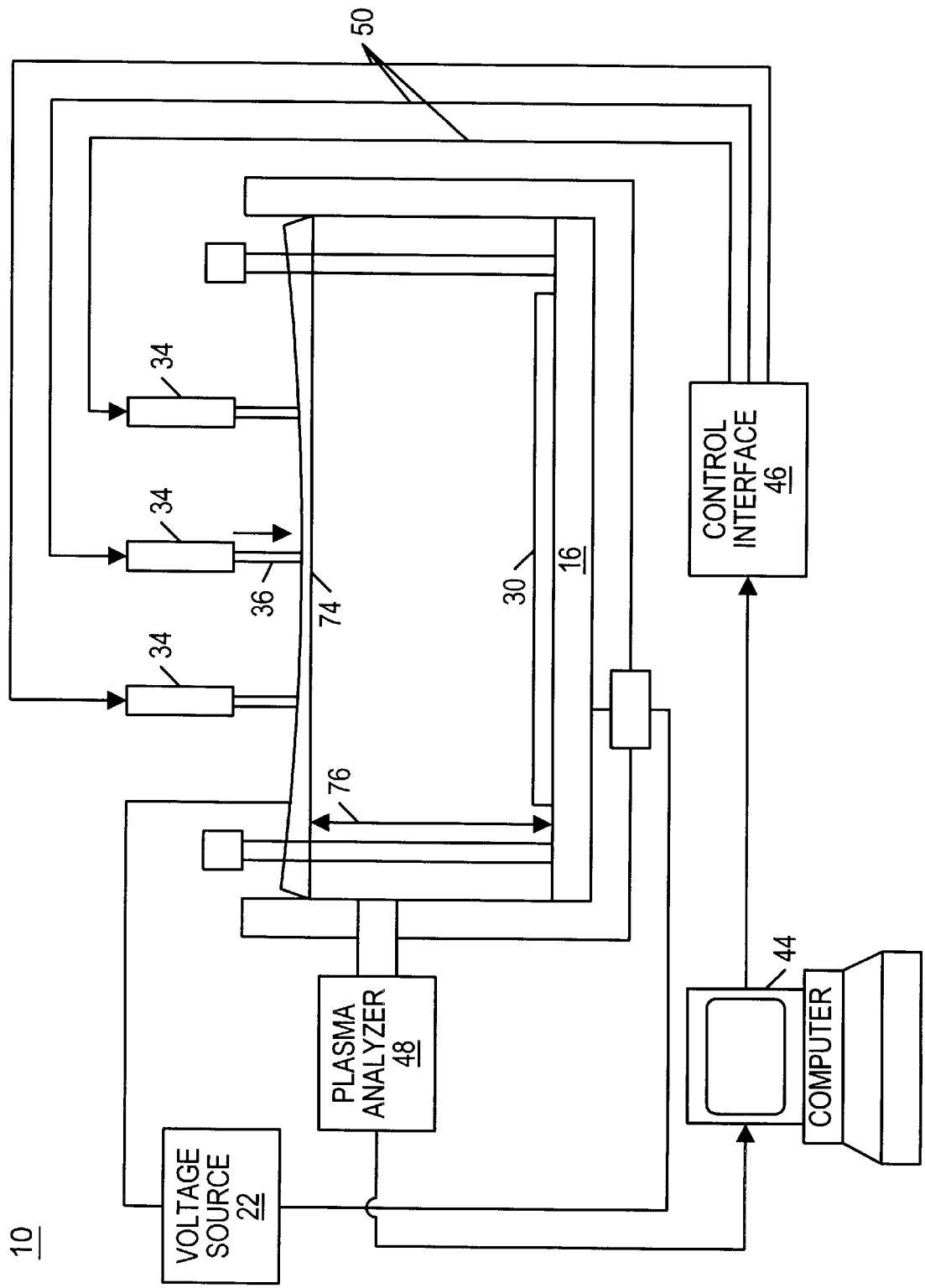
FIG. 8 is a partial side view of a semiconductor etching device having a convex shaped upper electrode adjusted in accordance with the present invention.
Figure 9:
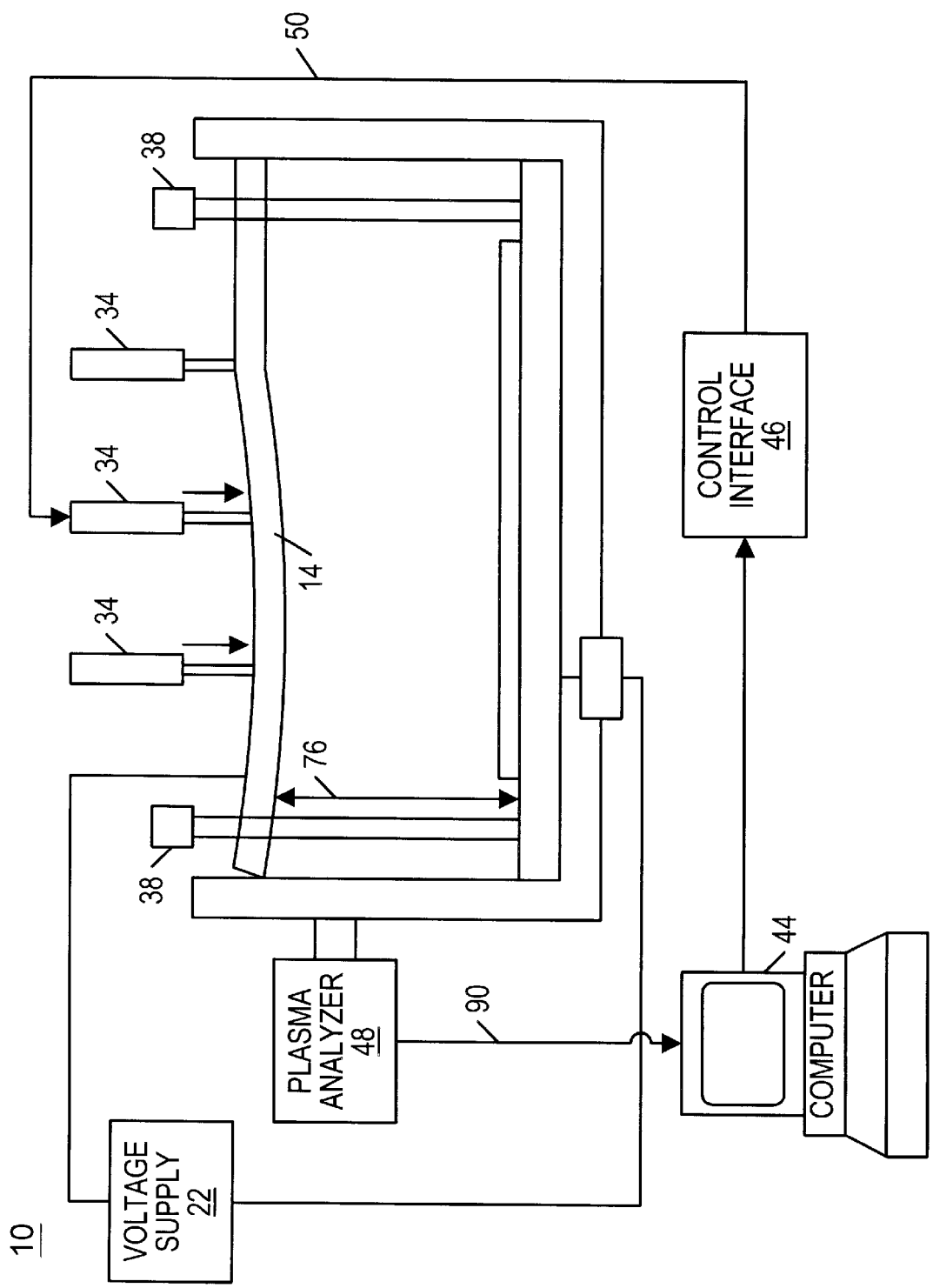
FIG. 9 is a partial side view of a semiconductor etching device having an upper electrode adjusted in accordance with the present invention.

FIGS. 7 through 9 show examples of how upper electrode 14 may be reshaped to reduce etch rate variations in accordance with the generated etch rate variation models previously generated. FIG. 7 shows a semiconductor etching device 10 with an upper electrode 14 in an unflexed state. As can be seen, the upper electrode 14 has a lower surface 74 which is concave due to material precipitation caused by the corrosive effects of etching plasma. Gap 76 between upper and lower electrodes 14 and 16, varies from one side of wafer 32 to the other. Ignoring the variations in etch rate caused by other process parameters, such as variations in plasma pressure and temperature, the variations in electrode gap will create variations in etch depth in wafer 32 unless the gap variations are corrected.

FIG. 8 shows the semiconductor etching device 10 of FIG. 7 with electrode 14 reshaped in accordance with one or more models provided by computer 44. In particular, plasma analyzer 48 measures variations in the process parameters in chamber 12. The measured variations are provided to computer 44 which accesses its library to identify a model having process parameter variations similar to those provided by plasma analyzer 48.

Once an appropriate model is identified, the measured etch depths stored therein are analyzed by host computer 44 to select one etch depth with a maximum departure from an average value of the measured etch depths in the model. A position on the etched sample wafer associated with the selected etch depth, is mapped to a position on the upper electrode 14 which was aligned during the etching process. Moreover, the host computer 44 calculates a difference between the selected etch depth and the average etch depth. The position identified on the upper electrode 14 and the difference between the selected etch depths and the average etch depth, provide the necessary data for generating signals which drive at least one motor to selectively reshape upper electrode 14.

Alternatively, the etch depths stored in the model may be divided into groups with each etch depth in a particular group associated with a particular sector of the sample wafer. Each group in turn is analyzed to identify one etch depth which departs radically from the average of the etch depths within the group or across the wafer. Computer 44 then identifies positions on upper electrode which were aligned during the etching process with positions on the sample wafer which correspond to the selected etch depth. Computer 44 also calculates for each sector, a difference between the selected etch depth and the average etch depth. The identified upper electrode positions and the associated differences in selected etch depth and average etch depth, provide the necessary data for generating signals which drive one or more motors to selectively reshape upper electrode 14.

Computer 44 provides control interface 46 with the upper electrode positions to where one or more motors applies a electrode shaping force. Moreover, the magnitude of the force or forces to be applied to upper electrode 14 are also provided by computer 44 and are generated as a function of the average etch depth and one or more of the measured etch depths which radically depart therefrom.

Motor 34 applies a reshaping force to upper electrode 14 which substantially bends upper electrode 14 in a downward direction. It is to be noted however that the motor force 34 may apply an upward force to electrode 14 when, for example, upper electrode 14 has a lower surface which has been eroded into a convex shape or when variations in other process parameters so require. With the upper electrode 14 reshaped as shown in FIG. 8, the electrodes are then energized by voltage source 22 and the wafer 32 is etched by the ions of the plasma.

It is to be expected that with the reshaping of upper electrode 14, the etch depth across wafer 32 will be more uniform thus resulting in devices more likely to meet design specifications.

FIG. 9 shows a semiconductor etching device having an upper electrode 14 which has also been reshaped in accordance with the present invention. Here, plasma analyzer 48 measures process parameter variations within chamber 12. Computer 44 accesses its library of models with the process parameter variation measurements provided by plasma analyzer 48. Computer 44 selects one of the models in its library which has associated process parameter variations most closely related to that measured by plasma analyzer 48. Computer 44 then determines one or more points on upper electrode where one or more electrode shaping forces are to be applied. In FIG. 9, electrode 14 has been reshaped by applying two forces. These forces are generated by motors 34, where the motors are controlled by signals generated in accordance with the model selected by computer 44.

Even though FIG. 9 shows a variation in electrode gap 76 across the wafer 32 after electrode reshaping, this variation in electrode gap offsets expected etch rate variations caused by other process parameter variations. Accordingly, wafer 32 will be etched more uniformly.

With references to FIGS. 6 and 7, operation of host computer 44 operating in connection with control interface 46 to generate control signals for controlling motors 34 will now be described.

Interface control unit 46 can be provided by Parker Hannifin Corp. to include an isolating transformer 52. Depending upon interface control unit 46 load requirements, transformer unit 52 can be either a single phase or a three phase transformer. The transformer may add its tappings jumpered for either 120 volts single phase or 240 volts three phase at the output. A suitable single phase transformer can also be obtained from Parker Hannifin Corp., Part Nos. T0170 or T0171. Parker Hannifin Corp. can also provide suitable three phase transformers, Part Nos. T0185 and T0186.

Transformer 52 is typically used to receive an AC input, either 120 volts or 240 volts, and to convert that input to a level useable by interface control unit 46. Transformer 52 also sends its output to power supply 54 where it is then converted to a source of varying DC voltages. Output power supply 54 is coupled to interface control unit 46 as shown to provide power for interface control 46 and associated motors 34. Power supply 54 operates using internal rectifiers and smoothing capacitors well known in the art. A suitable power supply can be obtained from Parker Hannifin Corp., Part No. 7705.

Host computer 44 includes any standard programmable device. A suitable computer can be obtained from any IBM-compatible vendor such as, for example, CompuAdd Corp., Austin, Tex., Model No. 325. Host computer 44 includes an RS-232C port common with many standard computers. RS-232C is standard, well known in the industry and provides serial communication between data terminal equipment and data communication equipment. Interfacing a computer to a peripheral such as the plasma analyzer is one application. A suitable peripheral is any device which accepts serial communication such as ASCII format information over a 25 pin RS-232C connector. Communication between host computer 44 and control interface unit 46 is achieved by communication path 56. Software necessary to present communication over path 56 can be obtained from Parker Hannifin Corp. under the trade name "System 7 X Series Command." The System 7 user manual for control interface unit 46, Part No. 88-011270-01D, including a detailed listing of each X-series commands, is available in its entirety from Parker Hannifin Corp.

Figure 6:
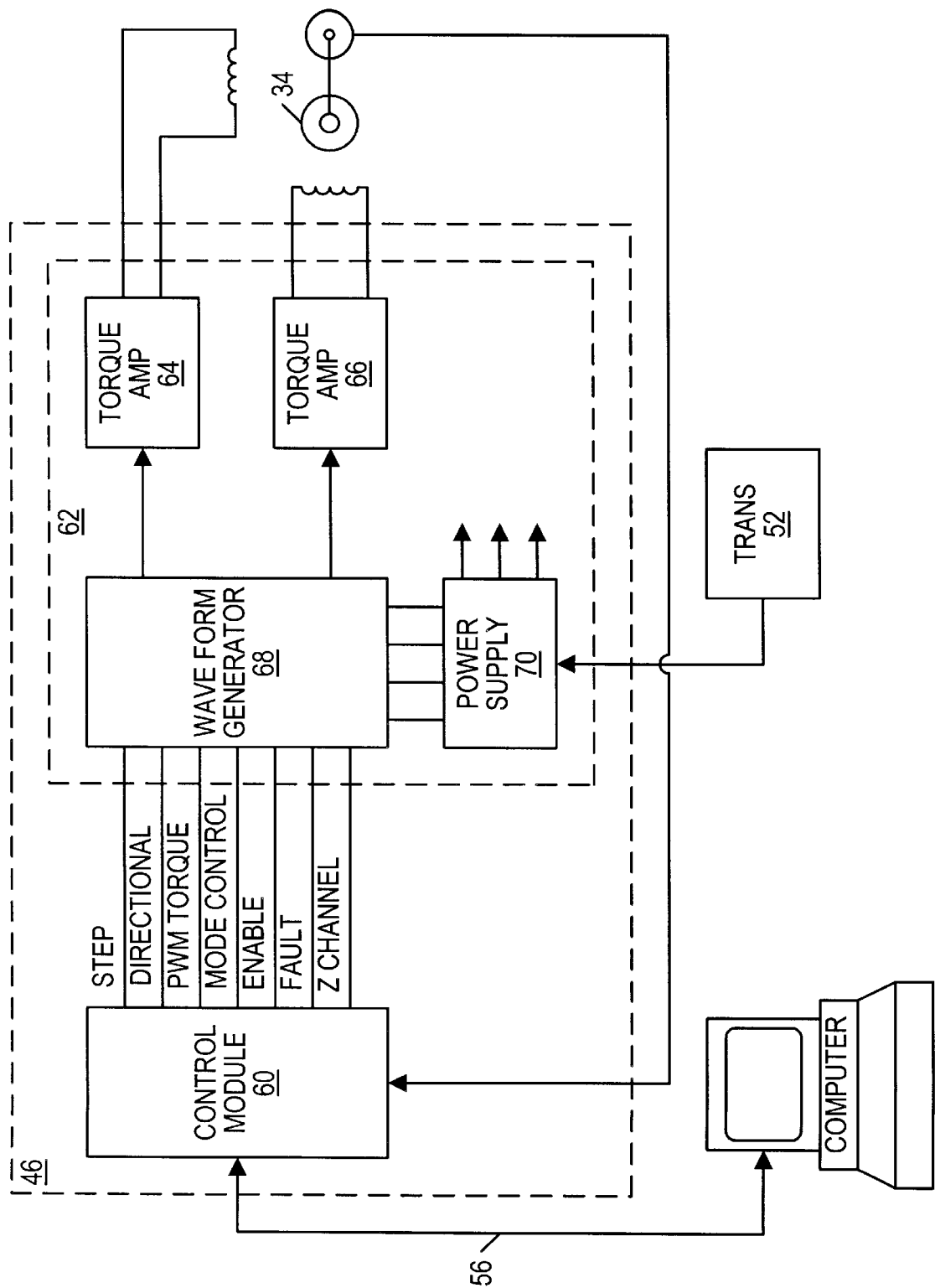
FIG. 6 is a block diagram of an interface control unit connected to an upper electrode adjustment motor, a computer and a power transformer according to the present invention.

Referring now to FIG. 6, a block diagram of the interface control unit 46 is shown along with connections to motors 34, transformer 52, and host computer 44. X-series commands are sent between host computer 44 and interface control unit 46 via path 56. Control module 60, which is part of control interface unit 46, receives signals from host computer 44 via path 56. Output from control module 60 includes a standard seven signal link necessary to control any type of motor 34 which may be used to adjust upper electrode. Thus, control module 60 functions with any type of motor such as a hybrid, AC brushless system, open loop stepper, and a brush DC servo. The seven signals link control module 60, drive module 62, and provide all necessary information to activate and deactivate drive module 62 and connected motors 34. FIG. 6 illustrates for simplicity purposes, connection to only a single motor 34. However, it is understood that multiple control modules and drive modules can be used and placed within control interface unit 46 to drive multiple motors 34.

The seven signals sent from control module 60 to drive module 62 are standard signals sent between a controller and a servo motor drive. The seven signals are fully opto-isolated at the drive end to eliminate the problems arising from noise. Step and directional signals, the usual inputs to a step or drive, are used with brushless servo drives. Enable signal enables and disables motor 34. With a servo drive, this signal can disable the motor if a controller fault occurs. It can also reset a fault condition. The fault signal derives from the drive to indicate a hardware power supply or temperature problem within controller 60. PWM (pulse width modulated) torque signal consists of pulses at a constant frequency. The width of the pulses are related to the torque demand of drive module 62. As the torque demand changes, the mark to space ratio will change. A 5% mark to space ratio gives maximum negative torque and a 95% mark to space ratio gives a maximum positive torque. A zero torque is produced with a 50% mark to space ratio. The motor current, accurately controlled by the PWM signal, is output by the torque amplifiers 64 and 66 within drive module 62. Mode control signal is specific to hybrid and AC brushless servo drive motors using feedback. It is used in power up initialization sequences. Z channel signal is a signal which can be used to monitor the position of shaft 36.

The seven signal link from control module 60 is connected to the drive module 62 and more specifically to waveform generator 68. Drive module 62 comprises dual torque amplifiers 64 and 66 to supply control current to each motor 34. Input to waveform generator 68 is from control module 60 via opto-isolators common in the art. These input signals are used within waveform generators 68 to generate the torque demand signals and send those signals to torque amplifiers 64 and 66. Torque amplifiers 64 and 66 supply current with the appropriate profile and phase to motor windings within each motor 34 under the control of the waveform generator 68. A switched mode power supply 70 operates at a frequency of approximately 80 Khz and uses output from transformer 52 to generate the internal supplies needed by drive module 62. In addition to these, two isolated supplies are generated. 5 volt power supplies are available to power control module logic and motor encoder. 12 volt power supplies are available for external machine control such as limit switches.

Waveform generator 68 is part of control interface unit 46 and therefore available from Parker Hannifin Corp. under self-contained package, Part No. 88-011270-01D. However, individual waveform generators can also be obtained from Parker Hannifin Corp., Part No. 7252. Waveform generator 68 includes an EEPROM which characterizes the drive (hybrid brushless) and contains the instructions necessary for an internal gate array to generate the appropriate current profiles. PWM torque signal determines the level of current required by motor 34. This data is fed into two digital-to-analog converters which provide the analog torque demand signals for the two torque amplifiers 64 and 66 which in turn provides the necessary electrode shaping force or forces.

It will be appreciated to those skilled in the art having the benefit of this disclosure that this invention is be believed to be capable of being applied with numerous types of semiconductor etching devices using a dry etch procedure. Various modifications and changes may be made without departing from the spirit and scope of the invention as set forth in the claims. It is intended that the following claims be interpreted to embrace all such modifications and changes.

What is claimed is:

1. A method of etching a silicon wafer, comprising the steps:
    placing a silicon wafer between aligned first and second electrodes of a semiconductor etching device, where the first electrode is defined by a first shape and is formed from a flexible material;
    providing an etching material between the aligned first and second electrodes;
    reshaping the first electrode into a second shape where the second shape is different from the first shape;
    applying a voltage difference between the first and second electrodes, and;
    etching the silicon wafer with the etching material.

2. The method of claim 1 wherein the first and second electrodes are defined by plates having inner surfaces facing each other, the first electrode further having an outer surface configured so that the inner and outer surfaces of the first electrode are oppositely facing, and wherein the reshaping comprises applying a force to the outer surface of the first electrode.

3. The method of claim 2 wherein the force is applied near a center position on the outer surface of the first electrode.

4. An electrode deformation method comprising the steps:
    aligning a sample wafer between aligned lower and upper electrodes of a semiconductor etching device, where the upper electrode is defined by a first shape;
    providing an etching material between the sample wafer and the upper electrode;
    applying a voltage difference between the upper and lower electrodes;
    etching the sample wafer with the etching material;
    mapping positions on the etched surface of the sample wafer to aligned positions on the upper electrode;
    measuring etch depth at a plurality of positions on the etched surface of the sample wafer;
    calculating an average etch depth from the measured etch depths;
    identifying a first measured etch depth having a maximum deviation from the average etch depth;
    identifying a first position on the etched wafer sample corresponding to the first measured etch depth;
    reshaping the upper electrode into a second shape, where the second shape is different from the first shape, by applying a force to a first position on the upper upper electrode, where the force has a magnitude proportional to the first measured etch depth, and where the first position on the upper electrode is mapped to the first position on the etched wafer surface.

5. The method of claim 4 wherein the upper electrode is formed from a flexible material.

6. The method of claim 5 wherein the force is applied in a direction transverse to an upper surface of the upper electrode.

7. The method of claim 4 wherein the first measured etch is a maximum measured etch depth relative to all the measured etch depths.

8. The method of claim 7 wherein the magnitude of the force is derived as a function of a difference between the maximum measured etch depth and the average etch depth.

9. The method of claim 4 wherein the first etch depth is a minimum etch depth relative to all the measured etch depths.

10. The method of claim 9 wherein the magnitude of the force is derived as a function of a difference between the minimum measured etch depth and the average etch depth.

11. A method of etching a wafer comprising the steps of:
    aligning a sample wafer between aligned lower and upper electrodes of a semiconductor etching device, where the upper electrode is defined by a first shape;
    providing a first etching material between the sample wafer and the upper electrode;
    applying a voltage difference between the upper and lower electrodes;
    etching the sample wafer with the first etching material;
    removing the etched wafer from the semiconductor etching device;
    mapping positions on the etched surface of the sample wafer to aligned positions on the upper electrode;
    measuring etch depth at a plurality of positions on the etched surface of the sample wafer;
    calculating an average etch depth from the measured etch depths;
    identifying a first etch depth having a maximum deviation from the average etch depth;
    identifying a first position on the etched surface of the sample corresponding to the first etch depth;
    reshaping the upper electrode into a second, different shape by applying a force to a first position on the upper electrode, where the force has a magnitude proportional to the first etch depth, and where the first position on the upper electrode is mapped to the first position on the etched sample wafer surface;
    aligning a second wafer between the aligned upper and lower electrodes of the semiconductor etching device, where the upper electrode is defined by the second shape;
    providing second etching material between the second wafer and the upper electrode;
    applying a voltage difference between the upper and lower electrodes, and;
    etching the second wafer with the second etching material.

12. The method of claim 11 further comprising measuring characteristics of the first etching material, wherein the second etching material is provided with characteristics substantially similar to the measured first etching material characteristics.

13. The method of claim 12 wherein measuring the characteristics of the first etching material comprises measuring first etchant material temperature at a plurality of positions near a the sample wafer.

14. The method of claim 12 wherein measuring the characteristics of the first etching material comprises measuring reactivity between the first etching material and the sample wafer at a plurality of positions near the sample wafer.

15. The method of claim 11 wherein the upper electrode is formed from a flexible material.

16. The method of claim 11 wherein the force is applied in a direction transverse to an upper surface of the upper electrode.

17. The method of claim 11 wherein the first etch depth is a maximum measured etch depth relative to all the measured etch depths.

18. The method of claim 17 wherein the magnitude of the force is derived as a function of a difference between the maximum measured etch depth and the average etch depth.

19. The method of claim 11 wherein the first etch depth is a minimum etch depth relative to all the measured etch depths.

20. The method of claim 19 wherein the magnitude of the force is derived as a function of a difference between the minimum measured etch depth and the average etch depth.

21. A semiconductor etching device comprising:
a flexible upper electrode having outer and inner oppositely facing surfaces;
a lower electrode having outer and inner oppositely facing surfaces, wherein the inner surfaces of the upper and lower electrodes face each other and are substantially aligned;
a voltage source selectively connected to at least one of the flexible upper electrode and the lower electrode;
a chamber for containing an etching material between the upper and lower electrodes;
a movable shaft having upper and lower ends, the lower end engaging the outer surface of the flexible upper electrode whereby axial movement of the shaft with respect to the upper electrode, alters a shape of the flexible upper electrode;
a motor connected to the upper end of the shaft, for providing axial movement to the shaft.

22. The semiconductor etching device of claim 21 further comprising a host computer in data communication with the motor, whereby the movable shaft moves axially in accordance with motor command signals generated by the host computer.

23. The semiconductor etching device of claim 22 further comprising an etching material analyzer configured for measuring characteristics of etching material inside the chamber and generating signals representative thereof, said plasma generator being in data communication with the host computer.

24. The semiconductor etch device of claim 23 wherein the host computer contains a memory for storing a look up table which translates signals, representative of etching material characteristics in the chamber, into motor commands.

25. The semiconductor etching device of claim 21 further comprising:
a second movable shaft having upper and lower ends, the lower end engaging the outer surface of the flexible upper electrode whereby axial movement of the shaft with respect to the upper electrode, adjusts the shape of the inner surface of the flexible upper electrode;
a second motor connected to the upper end of the second shaft, for providing axial movement to the shaft, the second motor being in data communication with the host computer whereby the second movable shaft moves axially with respect to the upper electrode in accordance with motor commands generated by the host computer.

* * * * *